United States Patent [19]

Shirey et al.

[11] Patent Number: 4,488,110

[45] Date of Patent: Dec. 11, 1984

[54] VOLTAGE MONITOR WITH VISIBLE LEVEL INDICATOR

[75] Inventors: Thomas F. Shirey, Hinsdale; William C. Serviss, Worth, both of Ill.; Curtis H. Young, Jr., Doraville, Ga.

[73] Assignee: Electro-Sensor, Inc., Oak Lawn, Ill.

[21] Appl. No.: 220,999

[22] Filed: Dec. 29, 1980

[51] Int. Cl.³ .................... G01R 19/14; G08B 21/00
[52] U.S. Cl. .................................. 324/133; 324/433; 340/661
[58] Field of Search ............... 324/133, 196, 158 MG, 324/433; 307/358, 362, 363; 330/69, 250, 251; 340/660, 661, 662

[56] References Cited

U.S. PATENT DOCUMENTS 4,086,531  4/1978  Bernier ...................... 324/158 MG
4,156,845  5/1979  Muellner et al. ........... 324/158 MG

OTHER PUBLICATIONS

Bellamy, "Power Line Voltage Dip Detection", 5/1975, IBM Technical Disclosure Bulletin, vol. 17, No. 12, p. 5513.

French, "Hi—Lo Voltage Comparator", 9-1977, Radio and Electronics Constructor, vol. 31, No. 2, pp. 86-88.

Primary Examiner—Michael J. Lynch
Assistant Examiner—Walter E. Snow
Attorney, Agent, or Firm—Keil & Weinkauf

[57] ABSTRACT

There is provided a voltage monitor which monitors a first voltage. A means for providing a reference second voltage is provided. Also, a signal third voltage which is obtained from and is proportional to the first voltage is provided. A comparison amplifier for comparing the reference second voltage and the signal third voltage produces an output voltage which goes to a first polarity when the signal third voltage exceeds the reference second voltage and which goes to a second polarity when the signal third voltage is less than the reference second voltage. Also, there is provided at least one indicator and at least one driver amplifier which amplifies the output voltage and drives the indicator into a first state when the output voltage shows that the signal third voltage exceeds the reference second voltage, and drives the indicator into a second state when the output shows that the signal third voltage is less than the reference second voltage. The circuit is arranged so that the power supply voltage and current for all elements of the voltage monitor are taken from the first voltage to be monitored.

4 Claims, 6 Drawing Figures

VOLTAGE MONITOR WITH VISIBLE LEVEL INDICATOR

BACKGROUND OF THE INVENTION

This invention relates generally to devices for monitoring the voltage of a direct current source, such as a storage battery or the like. This invention is particularly adaptable to monitor battery activated systems such as the ignition systems of automobiles, trucks and boats.

Furthermore the novel circuit of the invention is admirably suited to control other equipment as the voltage under monitor passes through a preset value. As an example, the invention is well suited to monitor the voltage of a battery and also to control a generator or alternator which is used to charge the battery.

A particular novel and useful feature of the circuit of the invention is that it uses only one reference voltage. Furthermore the invention uses only one set point voltage derived from the battery. The reference voltage of the invention is taken from a voltage reference source such as a zener diode, or from a stabilized voltage source macrocircuit the reference voltage of which is not sensitive to temperature.

In contrast, the voltage monitors of the prior art have been known to demonstrate temperature sensitivity, which is detrimental in the automotive environment where automobiles may be subjected to extremely low temperatures during the winter. Also these prior art monitors suffer from excessive current drain and, in some cases, require switching in order to compare the battery voltage with a reference voltage. Some prior art voltage monitors require a thermistor network to compensate for fluctuations of component values over a range of temperature. Further prior art voltage monitors employ incandescent bulbs and alarm bells, all of which draw large currents and make continuous monitoring of the battery voltage level impracticable. In contrast, the present invention presents a low current drain to the battery and therefore allows continuous monitoring of the battery voltage.

Other prior art voltage monitors teach two reference voltages and two set point voltages, where other prior art teaches only one reference voltage but two set point voltages. Two reference voltages or two set point voltages make adjustment of a voltage monitor very difficult. In contrast, the present invention teaches only one reference voltage and one set point voltage. The present invention cleverly combines the novel features of one reference voltage, one set point voltage, and all power for the device being drawn from the voltage source being monitored.

SUMMARY OF THE INVENTION

There is claimed a voltage monitor comprising: a first voltage to be monitored; a means for providing a reference second voltage; a signal third voltage which is a function of said first voltage; a comparison amplifier for comparing said reference second voltage and said signal third voltage, and producing an output which shows that said signal third voltage exceeds or is less than said reference second voltage; at least one indicator; at least one driver amplifier which amplifies said output and drives said indicator into a first state when said output shows that said signal third voltage exceeds said reference second voltage, and drives said indicator into a second state when said output shows that said signal third voltage is less than said reference second voltage; power supply voltage and current for all elements of said voltage monitor taken from said first voltage to be monitored.

DETAILED DESCRIPTION OF THE PREFERRED EMBODIMENT

Since the primary use of the voltage monitor we have invented is in conjunction with 12 volt systems, this detailed description refers to such a system. However, the principles applicable to 12 volt systems as set forth herein may be adapted to other systems as the need arises. Such adaptations may be performed by persons of ordinary skill in this art upon reading the specification.

Figure 1:
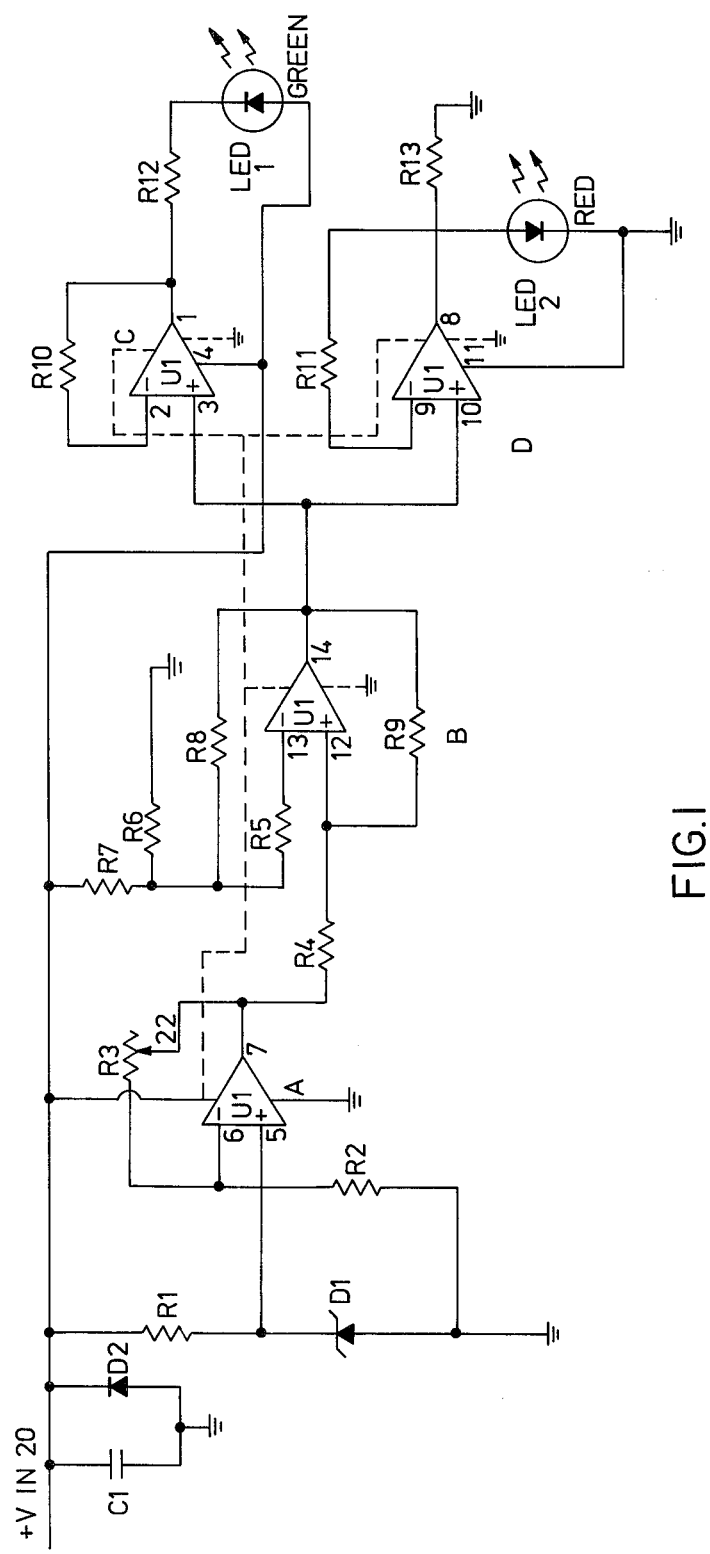
FIG. 1 is a schematic circuit diagram of a voltage monitoring device in accordance with this invention.

An embodiment of the present invention which has proven to perform satisfactorily is depicted in FIG. 1. A positive 12 volt input voltage 20 is taken from the voltage source to be monitored. The circuit is protected from transients by capacitor C1, and is protected from reverse polarity connection by diode D2.

Device D1 is a voltage reference source and could be a zener diode or a precision voltage reference device such as a National Semiconductor Precision Reference integrated circuit type LM 329 DZ. The National type LM329DZ has proven to be particularly useful because of its stability and its stable operation over a range of temperatures. Register R1 biases device D1 into its regulation range, and a value of 7,500 ohms has been found to be suitable. The voltage provided at the junction of R1 and D1 is given as 6.9 volts on the specification for the National LM329DZ, but in practice units have been found to provide up to 7.3 volts. However the voltage at the junction R1 and D1 will not vary more than about 50 millivolts over a temperature range of 0° F. to 150° F., when the National LM 329 DZ integrated circuit is utilized for D1.

Figure 2:
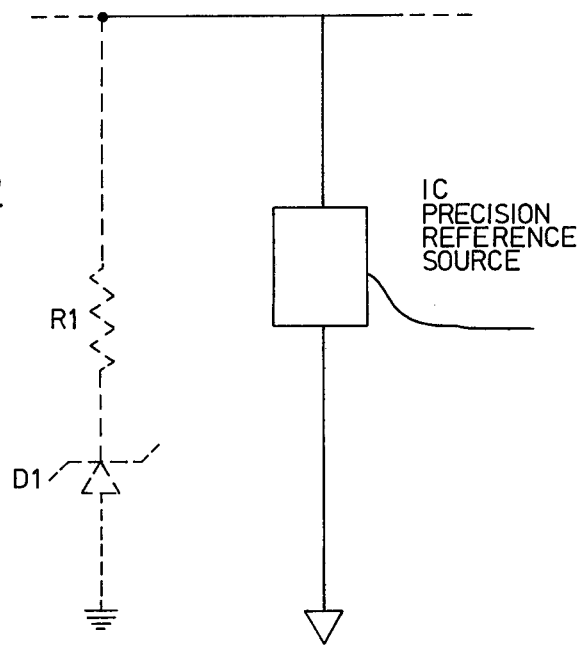
FIG. 2 is a schematic showing an integrated circuit precision reference voltage source as a replacement for R1 and D1.

FIG. 2 illustrates the substitution of an integrated circuit precision reference source with output end for the diode D1, resistance R1 and junction of FIG. 1.

The junction of R1 and D1 is connected to pin 5 of operational amplifier U1A. National Semiconductor integrated circuit LM 324 N has been found to perform well as operational amplifier U1A. The integrated circuit, National Semiconductor LM 324 N, comprises four (4) operational amplifiers on a single integrated circuit, the present invention uses all four operational amplifiers found on the chip, and the amplifiers are designated as "A", "B", "C" and "D". The electrical characteristics of the four amplifiers A, B, C and D are identical. Therefore pin 5 of operational amplifier (OP AMP) U1A is connected to a stable voltage reference source comprising D1. Inputs to op amp U1A are pins 5 and 6. The other input pin 6 of op amp U1A is connected to one end of resistor R2, the other end of which is connected to ground. Also pin 6 is connected to one end of variable resistor R3, the variable element 22 of resister R3 is connected to pin 7 of op amp U1A. Pin 7 is the output of op amp U1A. Resistors R2 and R3 provide a variable voltage divider which provides a voltage feed back for op amp U1A. The voltage at pin 7 of op amp U1A can be varied from about 7 volts to about 10 volts, depending upon the setting of resistor R3. Values of 20,000 ohms for resistor R2 and a ten turn potentiometer of resistance 10,000 ohms for variable resistor R3 have been found to be suitable. It is suitable to use a 5% tolerance resistor for R2, and to use a Beckman type 89 PR 10K pot for resistor R3. In operation, pin 7 of op amp U1A provides a variable, stable, reference voltage, which can be set between approximately 7 volts to 10 volts by varying the setting of resistor R3.

The variable, stable, reference voltage provided at pin 7 of op amp U1A is connected to a first end of resistor R4, the second end of resistor R4 is connected to pin 12 of op amp U1B. Pins 12 and 13 provide input to op amp U1B. Pin 14 is the output of op amp U1B. Resistors R6 and R7 provide a voltage divider on the input voltage 20. A value of resistor R7 of 390 ohms and resistor R6 of 910 ohms have been found to be satisfactory. The junction of resistors R6 and R7 provide the signal voltage taken from the voltage to be monitored, input voltage 20. Also the junction of resistors R6 and R7 is connected to a first end of resistor R5, the second end of resistor R5 is connected to pin 13 of op amp U1B. Resistors R8 and R9 each have a first end connected to pin 14 which is the output of op amp U1B. The second end of resistor R9 is connected to pin 12 of op amp U1B. The second end of resistor R8 is connected to the junction of resistors R6 and R7. Resistors R4 and R9 provide a feedback loop for op amp U1B. Also resistor R8 provides feedback for op amp U1B, and resistor R5 provides feed back for op amp U1B. In operation, pin 12 of op amp U1B is held at a reference voltage provided by pin 7 of op amp U1A. Pin 13 of op amp U1B is driven to higher voltage when the input voltage 20 rises, and is driven to lower voltage when the input voltage 20 falls.

The values of resistors R6 and R7 are chosen so that pin 13 of op amp U1B will be at the voltage of pin 12 when the input voltage 20 is at the value which it is desired to monitor. The voltage of pin 12 is set by the choice of fixed reference voltage D1 and the setting of variable resistor R3. The adjustment to substantial equality of the voltages at pins 12 and 13 when voltage 20 is at its desired value is made by choosing values for resistors R6 and R7, choosing the value of the fixed reference voltage by selection of voltage reference source D1, by choosing the value of resistor R2, and by choosing the value and setting of variable resistor R3.

When the voltage level at pin 13 of op amp U1B is greater than the voltage at pin 12 of op amp U1B, then pin 14, the output of op amp U1B, is driven toward ground potential. When the voltage level at pin 13 of op amp U1B is less than the voltage at pin 12 of op amp U1B, then pin 14, the output of op amp U1B, is driven toward input voltage 20. Pin 11 provides the ground connection for the integrated circuit which comprises op amps U1A, U1B, U1C and U1D, and pin 4 provides the connection to input voltage 20.

Pin 14 of op amp U1B provides input to two driver amplifiers U1C and U1D by connection to pin 3 of op amp U1C and pin 10 of op amp U1D. When pin 14 of op amp U1B is driven toward input voltage 20, then pin 10 of op amp U1D is driven also toward input voltage 20, thereby causing op amp U1D to drive its output pin 8 toward input voltage 20, thereby causing current to flow through LED 2. LED 2 may be a red light emitting diode or a red flashing light emitting diode, and a Litronix type ERL 4403 has been found to be suitable. Suitable values for resistors R11 and R13 have been found to be, for R11 10,000 ohms and for R13 180 ohms. The choice of R13 limits the voltage rise of pin 8 of op amp U1D, and thereby limits the voltage applied to LED 2. Alternatively LED 2 could be a relay or other voltage activated switch which could be used to control remote equipment such as a charging generator or alternator. Also as pin 14 of U1B is driven toward input voltage 20, then pin 3 of op amp U1C is driven toward input voltage 20, and the action of op amp U1C drives pin 1 of op amp U1C toward input voltage 20. With pin 1 of op amp U1C driven toward input voltage 20, a low voltage is applied a cross LED 1, which is connected between pin 1 of op amp U1C and input voltage 20. LED 1 may be a green light emitting diode, and when it is it will not light when pin 1 of op amp U1C is driven toward input voltage 20.

When pin 14 of op amp U1B is driven toward ground, pin 3 of op amp U1C is driven toward ground, and action of op amp U1C drives pin 1 to ground. As pin 1 of op amp U1C is driven toward ground, the voltage across resistor R12 and LED 1 is driven toward the value of input voltage 20 thereby causing sufficient current to flow through LED 1, and when it is a light emitting diode, to emit light. Normally a green LED is chosen for LED 1, and a Fair child type FLV 350 has been found to be suitable. Resistor R12 limits the current flow through LED 1, and a value of 100 ohms has been found suitable. Resistor R10 has been found to be satisfactory with a value of 10,000 ohms. Also as pin 14 of op amp U1B is driven toward ground pin 10 of U1D is driven toward ground, and by action of op amp U1D pin 8 of op amp U1D is driven toward ground thereby applying a small voltage across LED 2. When LED 2 is a light emitting diode it will be extinguished and will not emit light because insufficient current will flow through it.

In normal operation, with LED 1 a green light emitting diode and LED 2 a red light emitting diode, then the operation of the invention is as follows:

(1) When input voltage 20 rises sufficiently so that the voltage on op amp U1B at pin 13 is above the reference voltage at pin 12, then the voltage at pin 14 will be driven toward ground by op amp U1B, and pin 14 of op amp U1B will drive pin 3 of op amp U1C toward ground, and action of op amp U1C will drive pin 1 toward ground thereby turning on green LED 1, and wlll drive pin 10 of op amp U1D toward ground thereby turning off red LED 2; (2) when input voltage 20 falls sufficiently for the voltage on pin 13 to fall below the reference voltage at pin 12, then the voltage at pin 14 will be driven toward input voltage 20, thereby turning on red LED 2 and turning off green LED 1. The invention thereby provides a visual means of determining the voltage of input voltage 20. In operation on a 12 volt system, the reference voltage at pin 12 and the values of resistors R6 and R7 are chosen so that the green LED 10 is on when the input voltage 20 exceeds 12 volts, and the red LED 2 is on when the input voltage 20 is below 12 volts. The switch point voltage at which the green LED 1 comes on will exceed the switch point voltage at which a falling voltage 20 turns on red LED 2 by approximately 50 millivolts because of the hysteresis built into the feedback circuits of op amp U1B.

It is necessary to have a variable reference voltage as is provided by reference source D1 and op amp U1A. In a production run in which many units of the voltage monitor are produced there will be differences in the components from unit to unit. It is a goal of the voltage monitor to switch the red LED on at a predetermined voltage, such as 11.95 volts. In order to achieve a switch on voltage for the red LED of 11.95 volts in all units in a manufacturing run, it is convenient to be able to adjust the voltage at pin 12 of op amp U1B over a range of approximately 6.9 volts to 10 volts. Once the voltage of pin 12 of op amp U1B is set, it will be very stable with respect to variations in temperature because the National Semiconductor Precision Reference source LM 329 DZ which has been found satisfactory as source D1 has an output variation of only approximately 50 millivolts over a temperature range of 0° F. through 150° F.

The feedback resistors R4, R9, R5 and R8 and the operation of op amp U1B provides a hysteresis in switch voltage of approximately 40 to 50 millivolts. In particular, when the red LED diode switch on voltage is adjusted to 11.95 volts as voltage 20 drops, then the green LED switch on voltage will be at about 11.99 to 12.0 volts. A dead band of 40 to 50 millivolts is convenient so that both red and green LEDs are not simultaneously on.

Figure 5:
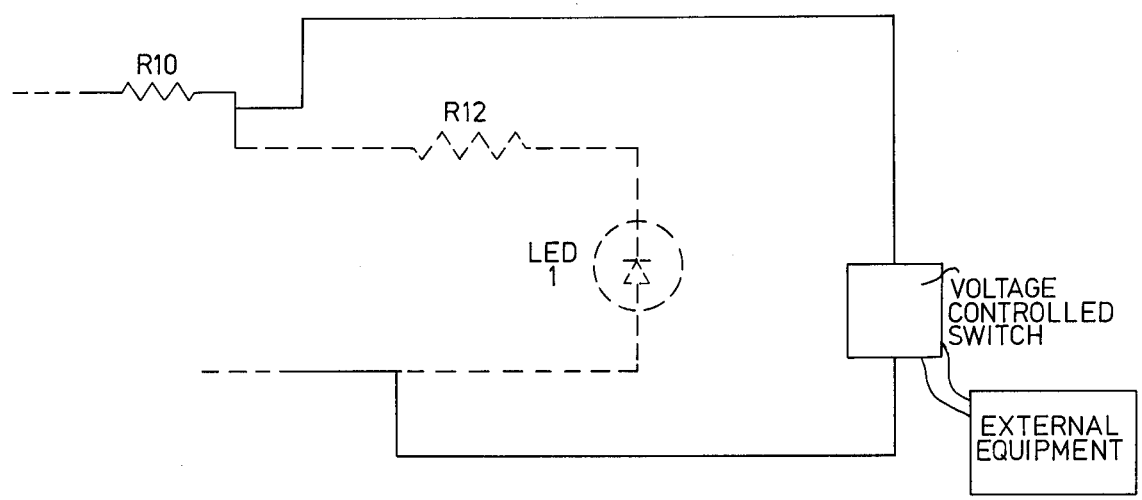
FIG. 5 is a partial schematic showing a voltage controlled switch replacing R12 and LED1.
Figure 6:
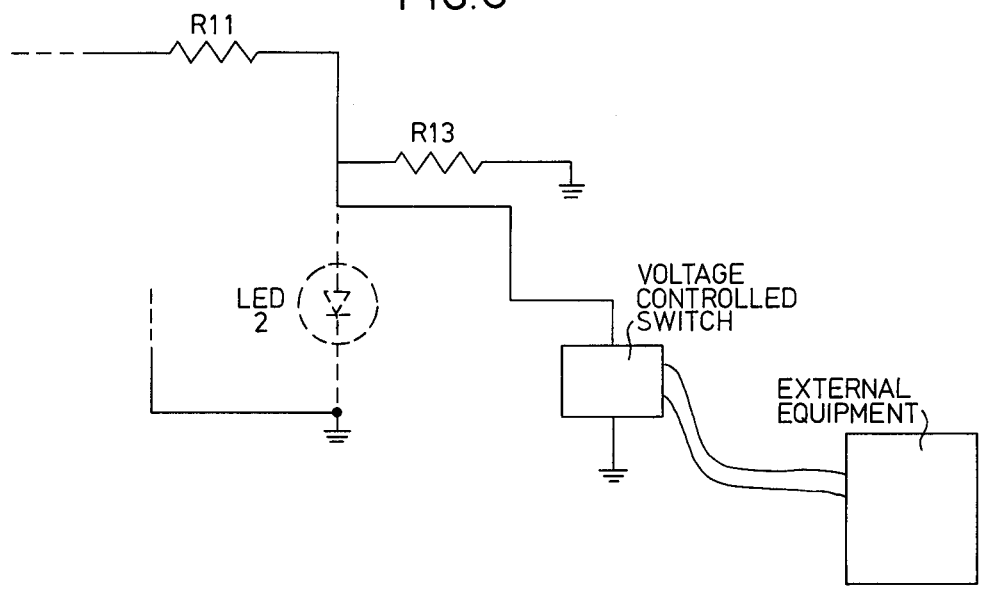
FIG. 6 is a partial schematic showing a voltage controlled switch replacing LED2.

LED 1 and LED 2 can be voltage sensitive switches such as relays, and they will be actuated as the input voltage passes through its "set" value. The voltage sensitive switches can be used to control other equipment substantially as shown in FIGS. 5 and 6, such as a generator or alternator which charges the battery which is being monitored.

Figure 3:
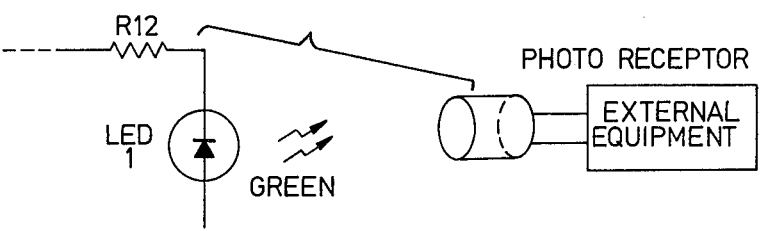
FIG. 3 is a partial schematic showing a photodetector optically coupled to LED1.
Figure 4:
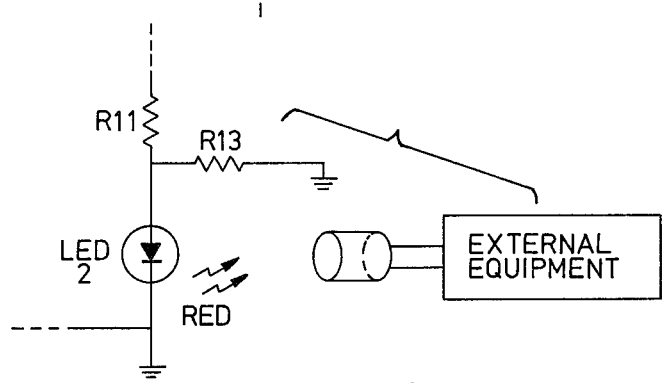
FIG. 4 is a partial schematic showing a photodetector optically coupled to LED2.

The voltage sensitive switch may be a light emitting diode optically coupled to a photo diode or to a photo transistor substantially as shown in FIGS. 3 and 4. Use of optical coupling to a photo receptor has the added advantage that the controlled circuit need not have electrical connection to the circuits of the present invention. A lack of electrical connection serves to protect the present invention from voltage surges and transients in the controlled circuits.

TABLE 1

PARTS LIST
For the Embodiment Shown in FIG. 1

| Part Number | DESCRIPTION | Manufacture and Part Number |
|---|---|---|
| C1 | .1 MF Ceramic Capacitor | |
| R1 | 7,500 ohm 5% Resistor | |
| R2 | 20,000 ohm 5% Resistor | |
| R3 | 10,000 ohm 10% Turn Trim Pot | Beckman 89PR10K |
| R4 | 2,700 ohm 5% Resistor | |
| R5 | 2,700 ohm 5% Resistor | |
| R6 | 910 ohm 5% Resistor | |
| R7 | 390 ohm 5% Resistor | |
| R8 | 1 megohm 5% Resistor | |
| R9 | 1 megohm 5% Resistor | |
| R10 | 10,000 ohm 10% Resistor | |
| R11 | 10,000 ohm 10% Resistor | |
| R12 | 100 ohm 10% Resistor | |
| R13 | 180 ohm 10% Resistor | |
| U1 | Integrated Circuit Four Op Amps | National Semiconductor LM 324 N |
| D1 | Precision Voltage Reference | National Semiconductor LM 329 DZ |
| D2 | Diode IN 4002 | |

TABLE 1-continued

PARTS LIST
For the Embodiment Shown in FIG. 1

| Part Number | DESCRIPTION | Manufacture and Part Number |
|---|---|---|
| LED 1 | Green LED | Fairchild FLV 350 |
| LED 2 | Red Flasher | Litronix ERL 4403 |

The foregoing description of the invention has been directed to a preferred embodiment in accordance with the requirements of the Patent Act, for the purpose of explaining the invention and not for the purpose of limiting the scope and spirit of what is claimed herein. It will be apparent to persons skilled in the art that modifications may be made in the device disclosed herein to suit the device to different environments and to different voltage requirements. The claims appended hereto are intended to set forth the true scope and spirit of this invention, including but not being limited to the particular embodiments disclosed hereinabove.

What is claimed is:

1. A voltage monitor which monitors a first voltage comprising:
  (a) a means for providing a fixed reference voltage and an operational amplifier of variable gain with input from said fixed reference voltage whereby the output of said operational amplifier provides a variable reference second voltage, the reference second voltage being at a lesser voltage than said first voltage;
  (b) a signal third voltage which is a fraction of said first voltage and is obtained by a voltage divider network from said first voltage;
  (c) a comparison amplifier which has a first input to which said reference second voltage is connected and a second input to which said signal third voltage is connected, and an output terminal, the voltage of said output terminal depending upon the difference of the two voltages applied to the first and second inputs;
  (d) polarity of said amplifier connected such that when said signal third voltage exceeds said reference second voltage then said output terminal of said comparison amplifier is driven toward ground, and when said signal third voltage is less than said reference second voltage then said output terminal of said comparison amplifier is driven toward power supply voltage;
  (e) a first indicator;
  (f) a second indicator;
  (g) a first driver amplifier
  (h) a second driver amplifier;
  (i) said first driver amplifier and said second driver amplifier each having its input connected to said output terminal of said comparison amplifier, wherein said first driver amplifier drives said first indicator on when its input is driven toward ground potential and drives said first indicator off when its input is driven toward power supply voltage, and wherein said second driver amplifier drives said second indicator on when its input is driven toward power supply voltage and drives said second indicator off when its input is driven toward ground potential;
  (j) power supply for said variable reference second voltage, said comparison amplifier, said first driver amplifier, said second driver amplifier, said first indicator, and said second indicator is taken from said first voltage to be monitored;

whereby the voltage monitor provides an indication of said first voltage to be monitored by turning on said first indicator and turning off said second indicator whenever said first voltage rises above a predetermined level, and turns on said second indicator and turns off said first indicator whenever said first voltage falls below said predetermined level, and further whereby said predetermined level of said first voltage is set by the value of said reference second voltage and the fraction of said first voltage at which said signal third voltage is set, and further whereby all power requirements of the voltage monitor are drawn from said first voltage.

2. A voltage monitor as claimed in claim 1, wherein said means for providing a fixed reference voltage comprises an integrated circuit precision reference source.

3. A voltage monitor as claimed in claim 1, wherein said means for providing a fixed reference voltage comprises a zener diode.

4. A voltage monitor as claimed in claim 1, wherein said operational amplifier comprises an operational amplifier with a first input connected to said fixed reference voltage, and a second input connected to a first end of a fixed resistor and a first end of a variable resistor, the second end of said fixed resistor connected to ground and the second end of said variable resistor connected to the output of said operational amplifier, whereby said fixed resistor and said variable resistor provide variable feedback for said operational amplifier, and further whereby said output of said operational amplifier provides a variable reference voltage.

* * * * *